United States Patent [19]

Koch

[11] 4,336,557

[45] Jun. 22, 1982

[54] MONOLITHICALLY INTEGRATED CIRCUIT FOR RELATIVELY SLOW READOUT FROM A TWO-DIMENSIONAL IMAGE SENSOR

[75] Inventor: Rudolf Koch, Germering, Fed. Rep. of Germany

[73] Assignee: Siemens Aktiengesellschaft, Berlin & Munich, Fed. Rep. of Germany

[21] Appl. No.: 164,258

[22] Filed: Jun. 30, 1980

[30] Foreign Application Priority Data

Sep. 11, 1979 [DE] Fed. Rep. of Germany ....... 2936703

[51] Int. Cl.³ .............................................. G11C 11/40
[52] U.S. Cl. .................................... 358/213; 365/183; 357/24
[58] Field of Search .................. 365/183, 189; 357/24; 307/279; 358/213

[56] References Cited

U.S. PATENT DOCUMENTS 4,117,514 9/1978 Terui et al. ......................... 358/213

FOREIGN PATENT DOCUMENTS 2642166 3/1978 Fed. Rep. of Germany ...... 365/183
2611771 5/1978 Fed. Rep. of Germany ...... 365/183

*Primary Examiner*—Terrell W. Fears
*Attorney, Agent, or Firm*—Hill, Van Santen, Steadman, Chiara & Simpson

[57] ABSTRACT

A monolithically integrated circuit for relatively slow readout of a two-dimensional image sensor and transfer of separate signal charge packets and noise charge packets from the image sensor to a pair of charge transfer devices has first and second intermediate memories for respectively storing the signal and noise charge packets which are connected to clock pulse voltages for successively transferring the packets to the charge transfer devices. An output stage connected to the charge transfer devices contains a difference circuit for subtracting the noise signal from the total signal to generate a readout representing only the signal generated by incident radiation on the sensor.

20 Claims, 8 Drawing Figures

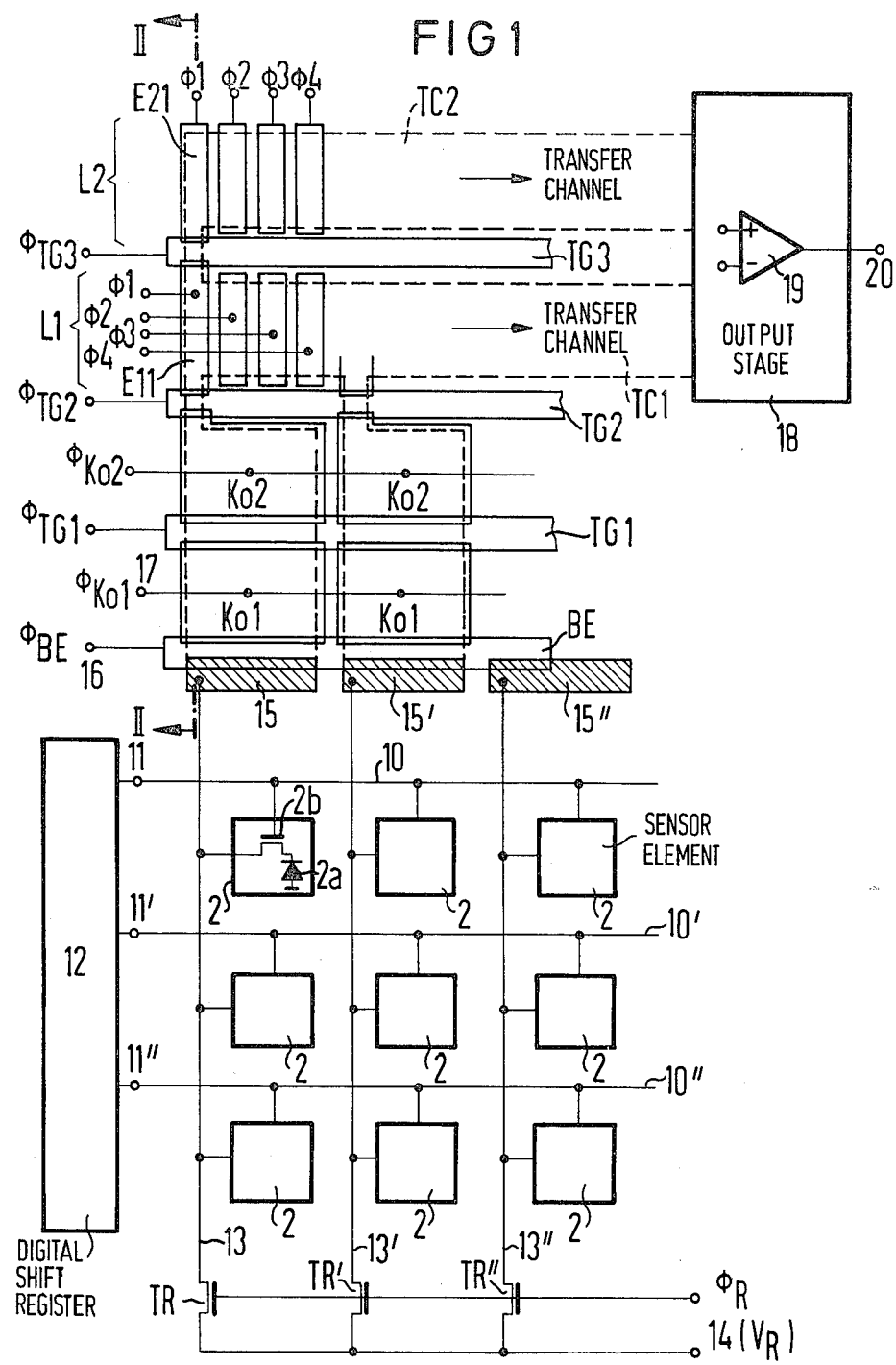

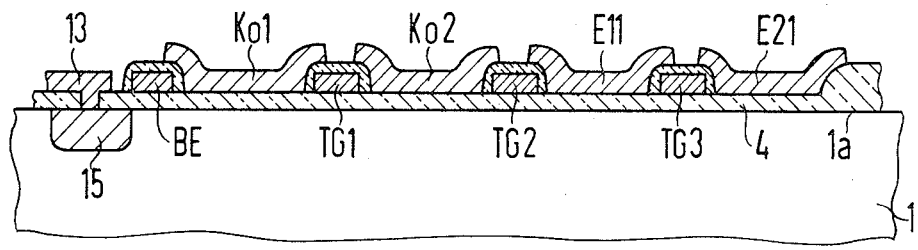
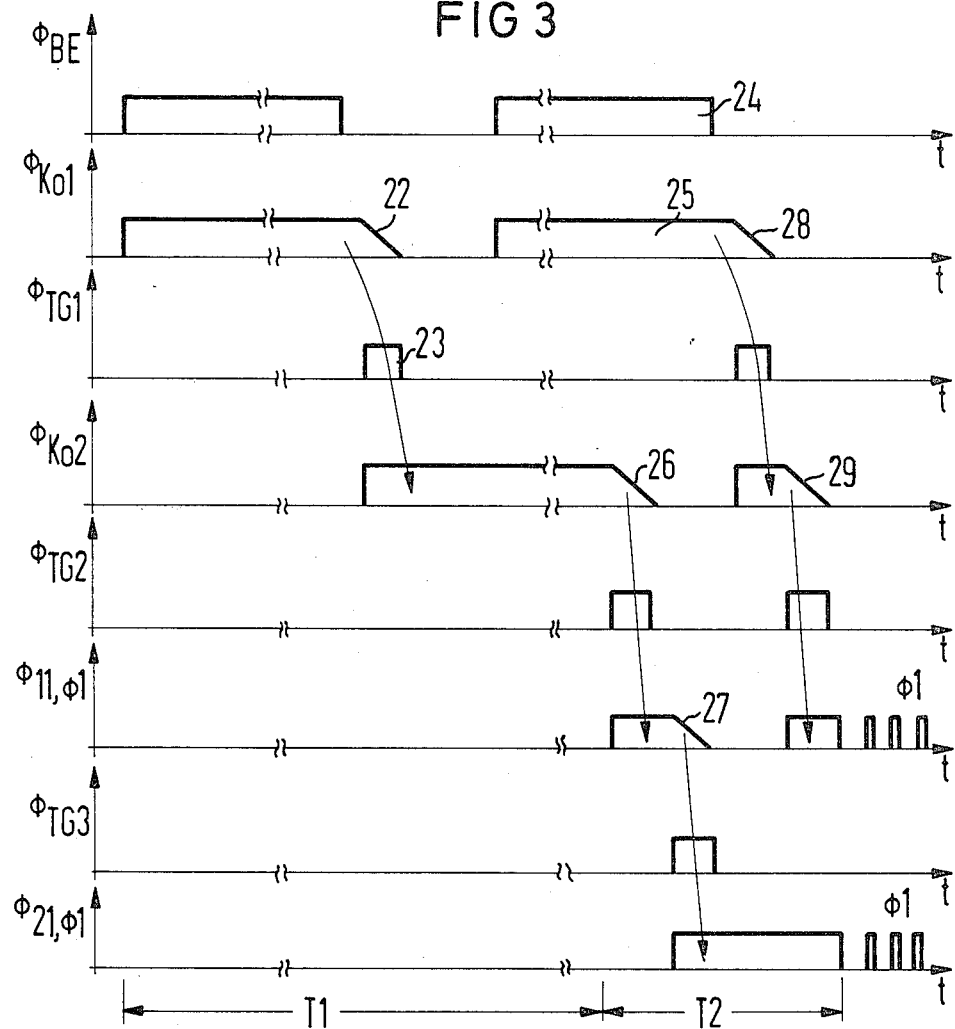

MONOLITHICALLY INTEGRATED CIRCUIT FOR RELATIVELY SLOW READOUT FROM A TWO-DIMENSIONAL IMAGE SENSOR

BACKGROUND OF THE INVENTION

1. Field of the Invention

The present invention relates to integrated circuits with two-dimensional image sensors and charge transfer devices for transferring signals read out from the image sensors, and in particular to such a circuit for undertaking a relatively slow readout of the image sensor.

2. Description of the Prior Art

An integrated circuit with a two-dimensional semiconductor image sensor having a plurality of sensor elements arranged in rows and columns, with sensor elements in a particular column being connected by a common column line and in which a barrier gate, a storage capacitor, and a transfer gate, all supplied with respective clock pulse voltages, are disposed between the column lines and various stages of an analog shift register is known from German No. OS 26 42 166 and German No. LP 26 11 771. Incomplete charge transfer can occur in this known circuit as a result of the time span for the readout of the sensor signals through the column lines and the barrier gate into the stages of the shift register being necessarily dimensioned too small. The charges remaining behind as a result of the incomplete charge transfer influence the succeeding charge transfers upon readout of the next lines of the image sensor. This problem is particularly acute when, for example, the circuit is used in the environment of a television display wherein the standard period for scanning and readout of an image line is 64 $\mu$s. Moreover, within the 64 $\mu$s period, 12 $\mu$s are allocated to the blanking gap between two line signals so that the parallel transfer of the signals from a sensor line over the barrier element into the shift register must occur within these 12 $\mu$s.

A proposed solution to accelerate the readout from the sensor elements is found in German No. OS 26 42 166 wherein a storage capacitor is inserted between the barrier element and each stage of the shift register into which a sensor signal is entered, with the storage capacitor being connected to the input of the shift register stage via a transfer gate.

Another problem in obtaining an accurate readout from sensors of this type is that of noise suppression, that is, suppression of charges which enter the charge transfer devices which were not directly generated as a result of incident radiation on the sensor elements. Such spurious charges may result from non-uniform characteristics of the sensor elements, imperfect coupling of the clock pulse voltages to the various elements and gates, temperature variations, and the like. One solution to this problem in the context of a two-dimensional image sensor is known from German No. LP 26 11 771 in which two shift registers are arranged next to each other and in which a first readout operation of the column lines is undertaken for readout of the total sensor signal, that is, the signal including the noise, into the first shift register, which is then followed by a second readout operation which ensues after a very short integration period during which substantially no charges are formed as a result of incident radiation so that the second readout represents a so-called fixed pattern noise, or zero signal. A difference circuit at the output of the shift registers receiving the respective signals therefrom determines the difference in the signals and generates as a circuit output a signal representing essentially only the result of the radiation incident on the sensors.

Sensor elements useable in conventional devices as well as in the circuit disclosed herein are known, for example, from the test "Solid State Imaging", P. G. Jespers et al (Editor), Noordhof Int. Publishing, Leyden, The Netherlands and the article "A 1,024 Element Linear CCD Sensor With a New Photodiode Structure", S. Ohba et al, Proceedings IEDM 1977, Washington, at pages 538–541.

SUMMARY OF THE INVENTION

It is an object of the present invention to provide an integrated circuit for transferring charges from a two-dimensional image sensor to a circuit output which utilizes charge transfer devices and in which the charge transfer from the image sensor to the charge transfer devices is undertaken relatively slowly and in which an output stage connected to the charge transfer devices undertakes a difference-formation of the signals received thereby for suppression of noise.

The above object is inventively achieved in an integrated circuit having a plurality of sensor elements arranged in rows and columns on a semiconductor substrate. All sensor elements in a column are connected to a common column line which is in turn connected to a reference potential through a switching transistor having a control gate connected to a clock pulse voltage. Upon the occurrence of a pulse in the clock pulse voltage, the column lines transfer a signal to a respective one of oppositely doped semiconductor regions in the substrate, each of which is allocated to a single column. The first such readout of the sensor elements is undertaken to obtain a total signal, that is, a signal representing not only charge carriers generated by radiation incident on the sensor elements but also charge carriers formed by reason other than the incident radiation, known as fixed pattern noise.

A charge packet generated in the oppositely doped semiconductor region is transferred across a barrier gate into a first storage capacitor and subsequently across a first transfer gate into a second storage capacitor. At this point, a second readout operation of the sensor elements is undertaken which is of a much shorter duration and is for the purpose of determining the fixed pattern noise. The signals read out during the second readout operation are transferred beneath the first storage capacitor in the same manner as was the first charge packet.

A first charge transfer device is disposed at a side of the second storage capacitor away from the first storage capacitor and a second transfer gate is disposed between the second storage capacitor and the first charge transfer device. Upon the occurrence of a clock pulse voltage supplied to the second transfer gate, the charge beneath the second storage capacitor is transferred beneath a first electrode of the first charge transfer device and the first transfer gate is again supplied with a pulse so that the fixed pattern noise charge packet is transferred beneath the second storage capacitor.

A second charge transfer device is disposed next to the first charge transfer device with a third transfer gate between the two devices. The third transfer gate is supplied with a clock pulse voltage to transfer the first charge packet from beneath the first electrode of the first charge transfer device to a first electrode of the second charge transfer device, and at the same time the second transfer gate is supplied with a pulse to transfer the fixed pattern noise charge packet beneath the first electrode of the first charge transfer device. The two signals in the respective charge transfer devices are then transferred along respective transfer channels of the devices in a known manner by sequentially phased pulsed voltages to an output stage which contains a difference circuit for determining the difference between the two signals. The final circuit output is thus a signal which corresponds to substantially only the signal resulting from radiation incident on the sensors, and is substantially noise-free.

In a second embodiment of the circuit, the two storage capacitors are disposed in parallel, rather than in series, between the oppositely doped regions and the first charge transfer device and a separate transfer gate is provided to effect transfer of charge at different times from the oppositely doped region to one of the storage capacitors. Transfer of the charge from the storage capacitors into the first transfer device occurs simultaneously followed by the subsequent transfer of one of the charge packets into the second transfer device.

In a third embodiment of the invention the storage capacitors are also disposed in parallel between the oppositely doped region and the charge transfer device, however, the second storage capacitor extends to the boundary of the oppositely doped region and has no transfer gate therebetween. Simultaneous transfer of the charges in the two storage capacitors is undertaken into the first charge transfer device at two electrodes thereof followed by transfer of the charge which was initially beneath the first capacitor into the second transfer device in the manner described above.

A fourth embodiment utilizes only a single transfer device to which the signals are supplied at alternate transfer stages.

DESCRIPTION OF THE DRAWINGS

FIG. 1 is a schematic circuit diagram of a monolithically integrated circuit for relatively slow readout from a two-dimensional image sensor constructed in accordance with the principles of the present invention.

FIG. 2 is a sectional view taken along line II—II of FIG. 1.

FIG. 3 is a voltage/time diagram for the clock pulses for operating the circuit shown in FIG. 1.

DESCRIPTION OF THE PREFERRED EMBODIMENTS

Figure 4:
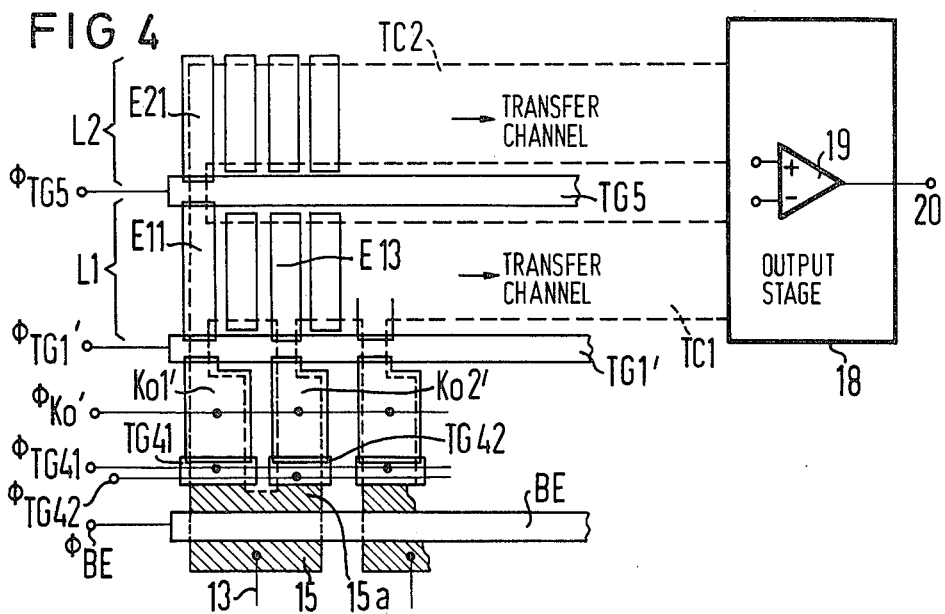
FIG. 4 is a schematic circuit diagram of a second embodiment of the circuit shown in FIG. 1.

A monolithically integrated circuit having a two-dimensional image sensor and associated charge transfer devices for undertaking a relatively slow readout of the image sensors and transferring the signals to an output stage is shown in FIG. 1. The circuit is monolithically integrated on a doped semiconductor body 1, shown in FIG. 2, which may, for example, consist of p-conductive silicon. The circuit contains a plurality of sensor elements 2 which are arranged in rows and columns. A portion of such sensor elements 2 is represented in FIG. 1, however, it will be understood that generally image sensors of this type contain 100 or more sensor elements per row and column. Each sensor element 2 in a first row are connected to a common row line 10 which is connected to an output 11 of a digital shift register 12. Similarly, a common row line 10′ for the next row is connected to an output 11′ of the digital shift register 12, a common row line 10″ is connected to an output 11″, and so on for succeeding common row lines. By each output 11 through 11″, all elements in a row associated therewith are simultaneously selectable.

Each sensor column has associated therewith a common column line which is represented at 13 for the first column, 13′ for the second column, 13″ for the next column and so on. Each column line is connected to an associated transistor TR, TR′, and TR″, each having a gate electrode connected to a common clock pulse voltage $\phi_R$, and which are connected through their respective source-drain segments to a terminal 14 at which a reference potential $V_R$ is supplied. The column lines 13, 13′, and 13″ are respectively connected to regions 15, 15′, and 15″ which have a conductivity opposite to that of the semiconductor body 1 and lie at the boundary surface thereof. The area of the semiconductor body 1 disposed adjacent to the regions 15 through 15″ is covered by a barrier gate BE which is separated from the boundary surface of the semiconductor body 1 by a thin electrically insulating layer 4, shown in FIG. 2, which may consist, for example, of silicon dioxide. The transfer gate BE has a terminal 16 to which a clock pulse voltage $\phi_{BE}$ is supplied.

The sensor elements 2 may consist, for example, of photodiodes 2a, as schematically represented in FIG. 1, with each photodiode 2a being connected to the associated column line, such as 13, through the source-drain segment of a field effect transistor 2b. The gate of the transistor 2b is connected to the corresponding row line, such as 10. The sensor elements 2 may also be comprised of metal-insulator-semiconductor (MIS) capacitors or maybe a charge injection device (CID) sensor which has two MIS capacitors disposed adjacent to each other. Any other suitable type of sensor element known to those skilled in the art may be utilized without departing from the inventive concept herein. Utilization of photodiodes is, however, most preferable from the standpoint of achieving a uniform spectral sensitivity.

At the side of the barrier gate BE facing away from the region 15 is a first storage capacitor Ko1, which may be a MIS capacitor, and which has an external electrode connected at a terminal 17 to a pulse voltage $\phi_{Ko1}$. The barrier gate BE represents a barrier to transfer of charge from the region 15 to the capacitor Ko1 when the amplitude of $\phi_{BE}$ is so small that a low transfer current is present. The gate BE, together with the region 15, may also be analogized to a transistor which is set by the amplitude of $\phi_{BE}$ to an operating point lying in the saturation range of the transistor, with the operating point determining a low drain current. An identical capacitor is disposed next to each of the other oppositely doped regions 15′ and 15″.

At the side of the first storage capacitor Ko1 facing away from the sensor element array is disposed a second storage capacitor Ko2 with a first transfer gate TG1 disposed between the capacitors. The transfer gate TG1 has a terminal to which a clock pulse voltage $\phi_{TG1}$ is supplied, and the second storage capacitor Ko2 has a terminal to which a clock pulse voltage $\phi_{Ko2}$ is supplied.

A first charge transfer device L1 is disposed next to the second storage capacitor Ko2 and has a series of extended electrodes, such as electrode E11 which receive charge from beneath the second storage capacitor Ko2 across a second transfer gate TG2 which is supplied at a terminal with a pulse voltage $\phi_{TG2}$. The first charge transfer device L1 has a transfer channel TC1 covered by a plurality of transfer electrodes which are successively supplied with clock pulse voltages $\phi 1$, $\phi 2$, $\phi 3$ and $\phi 4$ in a manner known in the art to transfer charge along the transfer channel TC1.

A second charge transfer device L2 is disposed next to the device L1 and also has a series of extended electrodes, such as E21, which receive charge from the first charge transfer device L1 across a third transfer gate TG3, which has a clock pulse voltage $\phi_{TG3}$ supplied to a terminal thereof. The transfer gates of the device L2 are also connected to clock pulse voltages $\phi 1$ through $\phi 4$ for transfer of charge along a transfer channel TC2.

An output stage connected at the end of the transfer channels TC1 and TC2 is generally referenced at 18 and which contains a difference-forming circuit 19, for example, a differential amplifier, for determining the difference between the signals transferred thereto and providing such difference at an output terminal 20.

The operation of the circuit shown in FIG. 1 will be explained in combination with the clock pulse voltages illustrated in FIG. 3. A readout of the sensor elements 2 in a line which is selected by the digital shift register 12 begins by resetting the elements 2 to the reference potential $V_R$ by switching the transistors 2b and TR, TR' and TR" to conducting states. Upon the termination of the pulse $\phi_R$, the transistors TR, TR', and TR" are again blocked, so that the column lines and the photodiodes are disconnected from external potentials and are in a floating state. Charge carriers optically generated in the photodiodes by incident radiation now reduce the potential of the column lines until the transistors 2b are switched to a nonconducting state. The time span between the blocking of the transistor TR and the blocking of the transistor 2b is designated as the integration time. The potential drop achieved at the end of the integration time is transferred to the column line and thereby to the oppositely doped region 15. Further discussion will utilize reference numerals associated with the left-most sensor element column, however, it will be understood that an identical operation proceeds for each succeeding column.

A charge packet stored in the region 15 is then transferred into the first storage capacitor Ko1 by the occurrence of a pulse supplied by the voltage $\phi_{BE}$ to the barrier gate BE. Upon the occurrence of the sloping edge 22 of the voltage $\phi_{Ko1}$ and the occurrence of a pulse 23 of the voltage $\phi_{TG1}$, the charge packet which was initially beneath the capacitor Ko1 is transferred into the second storage capacitor Ko2, which is at the potential $\phi_{Ko2}$. This transfer is represented by the arrow in FIG. 3.

After this charge transfer, a second readout operation of the sensor elements 2 is undertaken for which purpose the sensors 2 are again reset to the potential $V_R$. A significantly smaller integration time is utilized for the second readout operation so that the potential drops arising on the respective column lines correspond to the fixed pattern noise or zero signals which are generated by sensor-inherent noise. In the first readout operation, these signals were of course also present but were superimposed on the signals generated as a result of incident radiation. Upon the occurrence of a second clock pulse $\phi_{BE}$, referenced at 24 in FIG. 3, the zero signals are transferred into the first storage capacitor Ko1, and the pulse 25 of the voltage $\phi_{Ko1}$ is supplied thereto. As a result of the sloping edge 28 of the pulse 25 and another pulse associated with the voltage $\phi_{TG1}$, the charge packet now stored beneath the second storage capacitor Ko2 is transferred beneath the first transfer electrode E11 of the device L1, which is at a voltage $\phi_{11}$. A similar transfer occurs beneath electrodes in the first device L1 at spaced intervals along the transfer channel TC1.

As a result of the sloping edge 27 of the pulse voltage $\phi_{11}$ and a clock pulse $\phi_{TG3}$ supplied to the third transfer gate TG3, the signal is further transferred from beneath the electrode E11 of the first device L1 to a corresponding electrode E21 of the second device L2. The sloping edge 28 of the pulse 25 supplied to $\phi_{Ko1}$ now effects, together with a clock pulse $\phi_{TG1}$, the transfer of the zero signal charge into the capacitor Ko2. The sloping edge 29 of the voltage $\phi_{Ko2}$, together with the clock pulse $\phi_{TG2}$, effects the further transfer of the zero charge from the capacitor Ko2 into the zone beneath the electrode E11 in the first device L1, which is at the potential $\phi_{11}$.

The respective signals in the two devices L1 and L2 are then transferred by the application of successive phase voltages $\phi 1$ through $\phi 4$, with $\phi 1$ being shown in FIG. 3, to the output stage 18 where the difference of the signals is calculated.

The time span T2, shown in FIG. 3, during which the first charge corresponding to the entire signal is transferred from the capacitor Ko2 into the region beneath the electrode E21 and the zero signal is transferred into the region beneath the electrode E11 may, for example, correspond to the blanking gap between two television lines which is standardized at 12 $\mu$s. The time span T1 then corresponds to the remaining portion of the television line, and for the standard line of 64 $\mu$s amounts to 52 $\mu$s and is sufficient for depositing the sensor signals in the second capacitor Ko2. The storage of the zero signals in the capacitor Ko1 occurs partially within the time span T2. The readout of the devices L1 and L2 ensues after the time span T2 and may be continued up to the beginning of the next successive time span T2. Because T1 is significantly larger than T2, a relatively slow transfer of this sensor signal charges can be undertaken by the potential barrier BE into the storage capacitor Ko1, so that the transmission losses are largely eliminated.

A second embodiment of the circuit is shown in FIG. 4 wherein the stored capacitors are arranged in parallel between the barrier gate BE and a first transfer gate TG1', which is supplied with a clock pulse voltage $\phi_{TG1'}$. The oppositely doped region 15 is provided with an extension 15a for this purpose.

The storage capacitors in FIG. 4 are referenced at Ko1' and Ko2' and are respectively provided with transfer gates TG41 supplied with a clock pulse voltage $\phi_{TG41}$, and TG42 supplied with a voltage $\phi_{TG42}$. The capacitor Ko1' is joined across the transfer gate TG1' with the electrode E11 of the first device L1, and the capacitor Ko2' is joined with a succeeding electrode E13 of the device L1 across the gate TG1'. Transfer to the second device L2 still occurs, however, only between electrodes E11 and E21 and succeeding corresponding electrodes of the two devices.

Figure 5:
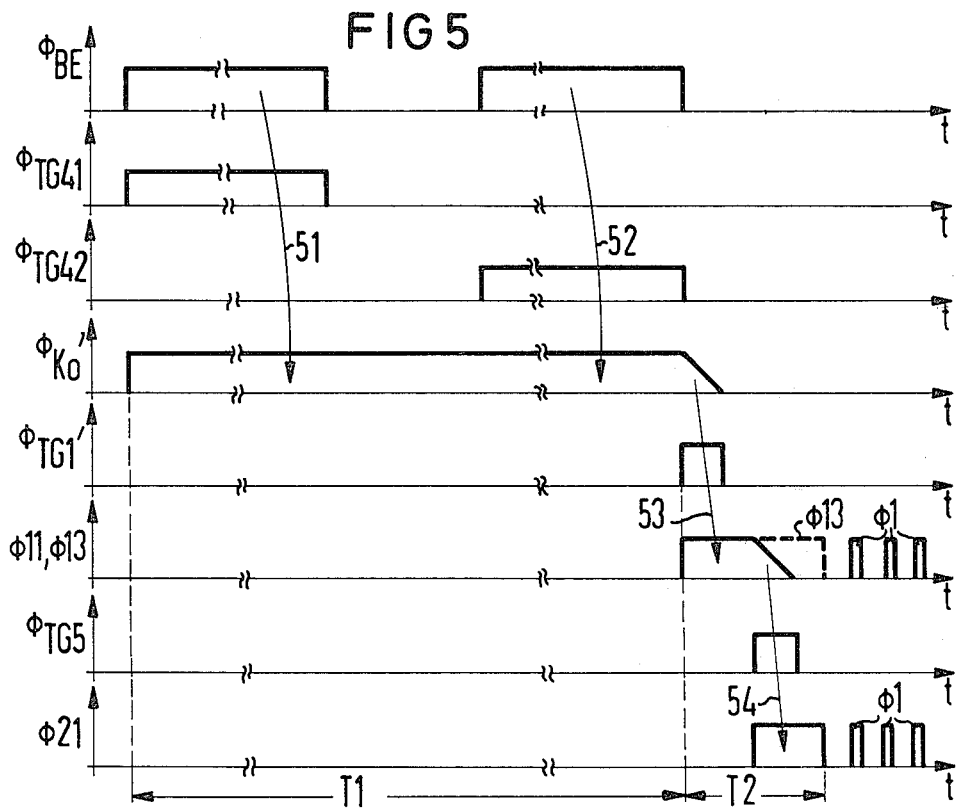
FIG. 5 is a voltage/time diagram for the clock pulse voltages for operating the circuit of FIG. 4.

Each of the capacitors Ko1' and Ko2' is supplied with a clock pulse voltage $\phi_{Ko'}$ as shown in FIG. 5. An intermediate storage of the signal charge in the capacitor Ko1 is shown by the arrow 51, and an intermediate storage of the zero signal charge in the capacitor Ko2 is indicated by the arrow 52 which proceed in succession in the same manner described with reference to FIG. 1. As indicated by the arrow 53, however, in the embodiment of FIG. 4 the charges of both capacitors are simultaneously transferred beneath the respective transfer electrodes E11 and E12. The electrode E11 is at a pulse voltage $\phi 11$ shown in FIG. 5 as the solid line, whereas the electrode E13 is at a voltage $\phi_{13}$ which is longer than $\phi_{11}$ by the portion indicated with the dashed lines. An arrow 54 indicates charge transfer from beneath the electrode E11 to the electrode E21. The charge is read into the devices L1 and L2 are again transferred electrode-by-electrode toward the output stage 18.

Figure 6:
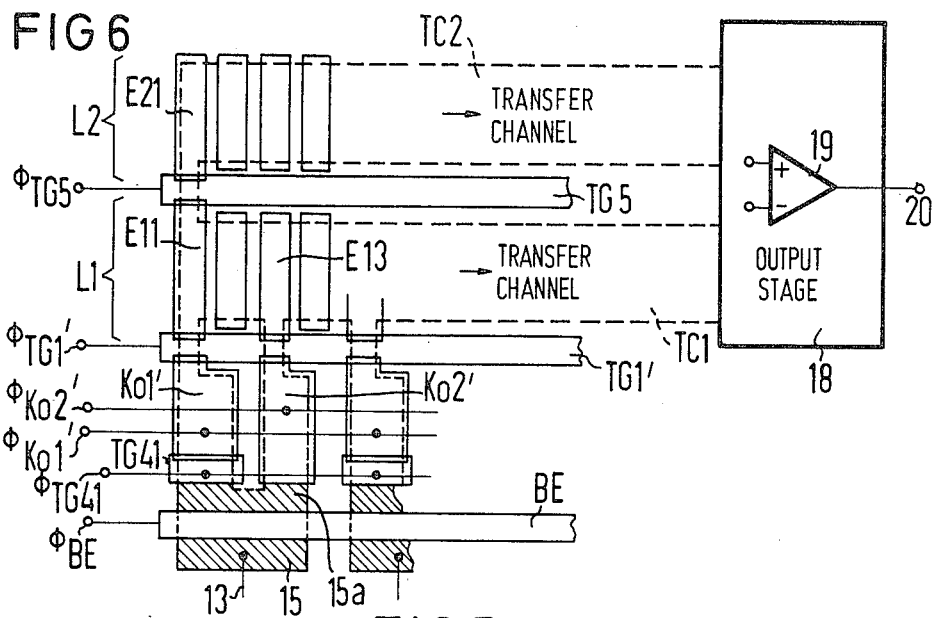
FIG. 6 is a schematic circuit diagram of a third embodiment of the circuit shown in FIG. 1.
Figure 7:
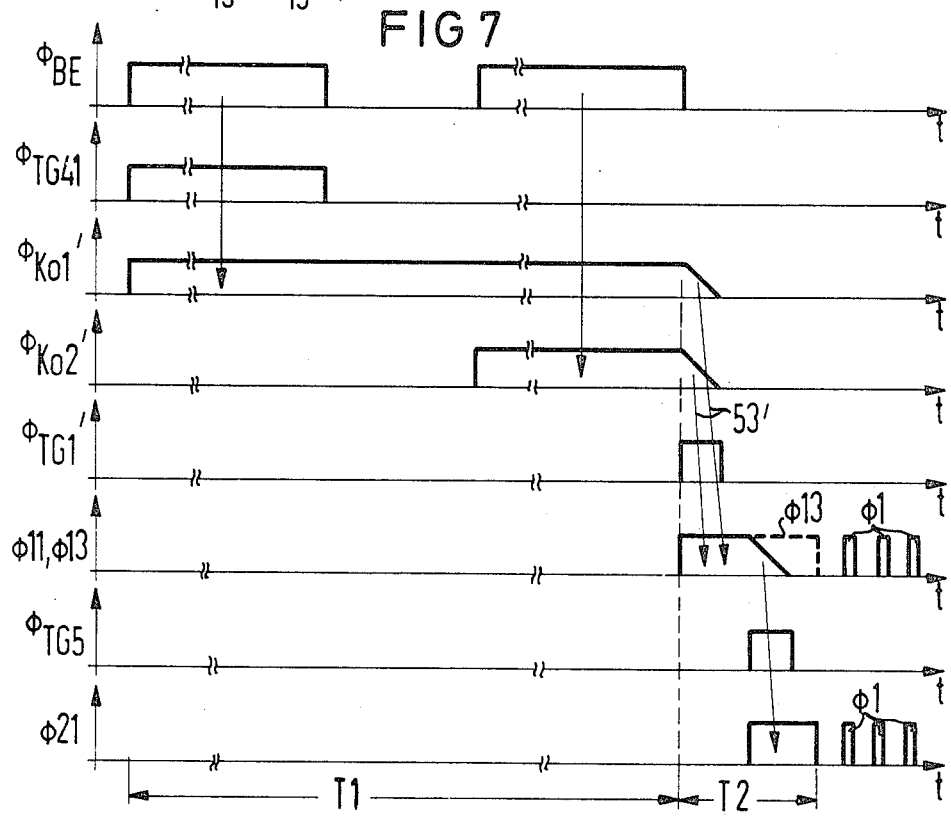
FIG. 7 is a voltage/time diagram for the clock pulse voltages for operating the circuit of FIG. 6.

A third embodiment of the circuit is shown in FIG. 6 wherein the capacitors Ko1' and Ko2' are supplied with respective pulse voltages $\phi_{Ko1'}$ and $\phi_{Ko2'}$. The transfer gate TG42 is omitted in the embodiment of FIG. 6 and the capacitor Ko2' is extended up to the boundary of the region 15a. The manner of operation of the circuit of FIG. 6 is shown in FIG. 7 which is substantially the same as the operation of the circuit of FIG. 4 except that a single transfer gate is utilized between the region 15 and the capacitors, and the simultaneous transfer of charge from the capacitor Ko1' and the capacitor Ko2' is shown by the double arrows referenced at 53'.

As was the case with the circuit shown in FIG. 1, very short time spans T2 for the charge transfers from the capacitors into the devices L1 and L2 can be achieved, whereas large time spans T1 are available for the intermediate storage of the signals in the storage capacitors.

Figure 8:
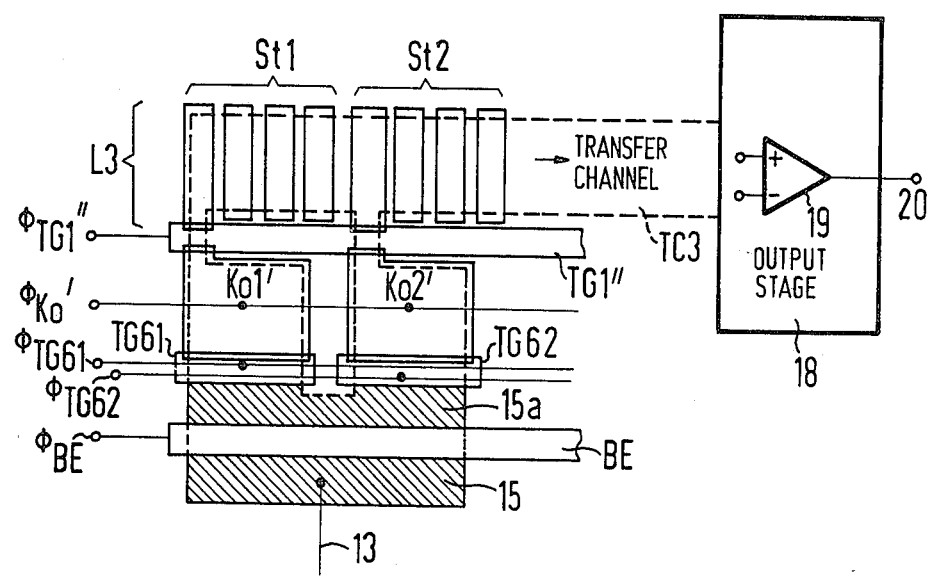
FIG. 8 is a schematic circuit diagram of the circuit of FIG. 1 having only one transfer device.

A fourth embodiment is shown in FIG. 8 which utilizes a single transfer device L3 and in which alternate stages St1 and St2 of the device L3 are respectively allocated to one column line 13. The transfer gates TG61 and TG62 respectively supplied with voltages $\phi_{TG61}$ and $\phi_{TG62}$ correspond to the gates and associated voltages TG41 and TG42 described in connection with FIG. 4. The transfer gate TG1" corresponds to the transfer gate TG1' in FIG. 4, as does the operating voltage associated therewith $\phi_{TG1''}$. The signal charges and the zero charges are respectively alternately divided between the stages St1 and St2 of the device L3 and are transferred in succession along the transfer channel TC3 to the output stage 18, after being entered into the device L3 in the same manner as described in connection with FIG. 4. The difference circuit 19 in the embodiment of FIG. 8 must then include a switching device to place the successively arriving charge packets from the transfer channel TC3 at the appropriate inputs to the difference-forming circuit.

In those embodiments employing the first and second storage capacitors in parallel, the clock pulse voltages associated with the transfer electrodes in the transfer devices may be selected so that the charge packets arrive at the output stage 18 simultaneously, thereby compensating for the fact that the charge packets enter the transfer devices beneath different transfer electrodes. Alternatively, the output stage 18 may be provided with circuitry to compensate for the two electrode-lag of the packets.

Although modifications and changes may be suggested by those skilled in the art, it is the intention of the inventor to embody within the patent warranted hereon all changes and modifications as reasonably and properly come within the scope of his contribution to the art.

I claim as my invention:

1. In a circuit monolithically integrated on a semiconductor substrate having a two-dimensional semiconductor image sensor with a plurality of sensor elements disposed in rows and columns, a plurality of column lines connecting all sensor elements in respective columns, a plurality of oppositely doped semiconductor regions respectively connected to said column lines for respectively generating charge packets corresponding to signals on said column lines, an output stage, a means for transferring charge to said output stage, a first storage capacitor supplied with a clock pulse voltage, a barrier element disposed between said first capacitor and said oppositely doped region, said barrier element supplied with a voltage for effecting transfer of charge from said oppositely doped region into said first storage capacitor, and a first transfer gate for transferring charge into said means for transferring charge to said output stage, the improvement of:
   a second storage capacitor disposed between said barrier element and said first transfer gate, said second storage capacitor supplied with a clock pulse voltage for transferring charge into said second storage capacitor from said oppositely doped region after charge previously in said oppositely doped region is transferred to said first storage capacitor.

2. The circuit of claim 1 wherein said first and second storage capacitors are disposed in series between said oppositely doped region and said means for transferring charge to said output stage and further comprising a second transfer gate supplied with a clock pulse, said second transfer gate disposed between said first and second storage capacitors for transferring charge from said first storage capacitor to said second storage capacitor.

3. The circuit of claim 2 wherein said means for transferring charge to said output stage comprises first and second charge transfer devices each having a transfer channel connected to said output stage and each having a plurality of transfer electrodes covering the respective transfer channels with a portion of equally spaced transfer electrodes in each device extending beyond said transfer channel in a direction perpendicular to charge transfer movement in said channel, said circuit further comprising a third transfer gate disposed between said first and second charge transfer devices for transferring charge from said extended transfer electrodes of said first device to beneath said extended transfer electrodes of said second device, whereby a first charge packet is transferred from said first storage capacitor to said second storage capacitor to said first transfer device to said second transfer device and a second charge packet is transferred from said first storage capacitor to said second storage capacitor to said first charge transfer device and said first and second charge packets are simultaneously transferred to the respective transfer channels to said output stage.

4. The circuit of claim 1 wherein said first and second capacitors are disposed in parallel between said oppositely doped region and said means for transferring charge to said output stage.

5. The circuit of claim 4 further comprising:
   a fourth transfer gate disposed between said oppositely doped region and said first storage capacitor supplied with a clock pulse voltage for transferring charge from said oppositely doped region to said first storage capacitor; and a fifth transfer gate disposed between said second storage capacitor and said oppositely doped region supplied with a clock pulse voltage for transferring charge from said oppositely doped region to said second storage capacitor, whereby said clock pulse voltage for said fifth transfer gate lags the clock pulse voltage for said first transfer gate for transferring charge from said oppositely doped region into said second storage capacitor after charge previously in said oppositely doped region is transferred into said first capacitor; and wherein said first and second storage capacitors are supplied with a common clock pulse voltage for effecting simultaneous transfer of charge from said first and second storage capacitors into said means for transferring charge to said output stage.

6. The circuit of claim 4 wherein said second storage capacitor extends above said oppositely doped region and is supplied with a clock pulse voltage for transferring charge from said oppositely doped region into said second storage capacitor further comprising:

a fourth transfer gate disposed between said first storage capacitor and said oppositely doped region supplied with a clock pulse voltage for transferring charge from said oppositely doped region into said first storage capacitor, whereby said clock pulse voltage for said second storage capacitor lags said clock pulse voltage for said fourth transfer gate for transferring charge from said oppositely doped region into said second storage capacitor after charge previously in said oppositely doped region is transferred into said first storage capacitor.

7. The circuit of claim 4 wherein said means for transferring charge to said output stage is comprised of first and second charge transfer devices each having a transfer channel connected to said output stage and each having a plurality of electrodes covering said respective transfer channels with a portion of said transfer electrodes extending beyond said transfer channels in a direction perpendicular to charge transfer movement in said channels and wherein charge is transferred from said first and second storage capacitors to beneath spaced transfer electrodes of said first charge transfer device, further comprising:

a third transfer gate disposed between said first and second charge transfer devices supplied with a clock pulse voltage for transferring charge from beneath said extended transfer electrodes of said first device to beneath said extended electrodes of said second device, whereby a first charge packet is transferred from said oppositely doped region into said first storage capacitor into said first charge transfer device and into said second charge transfer device and a second charge packet is transferred from said oppositely doped region into said second storage capacitor and into said second charge transfer device.

8. The circuit of claim 4 wherein said means for transferring charge to said output stage is a charge transfer device having a transfer channel connected to said output stage and having a plurality of transfer electrodes covering said transfer channel, a portion of said transfer electrodes extending beyond said transfer channel in a direction perpendicular to charge transfer movement and wherein said charge transfer device has a plurality of stages comprising transfer electrodes supplied with successive clock voltages and wherein charge is transferred from said first and second storage capacitors into respective alternate stages of said charge transfer device.

9. The circuit of claim 1 wherein said barrier element is a strip comprised of electrically conducting material disposed laterally between said oppositely doped region and said first and second storage capacitors.

10. The circuit of claim 1 wherein said barrier element is a transistor having a control terminal connected to a constant voltage source for defining an operating point in the saturation range of said transistor for determining a low drain current in said transistor.

11. The circuit of claim 1 wherein said sensor elements are comprised of photodiodes.

12. The circuit of claim 1 wherein said sensor elements are comprised of adjacent metal-insulator-semiconductor capacitors.

13. The circuit of claim 1 wherein said first and second storage capacitors are metal-insulator-semiconductor capacitors.

14. A method for effecting slow transfer of charge in a semiconductor device having a plurality of oppositely doped regions for generating said charge in response to received signals to an output stage, said circuit having first and second storage capacitors and a means for transferring charge to said output stage disposed between said oppositely doped regions and said output stage comprising the steps of:

transferring a first charge packet from said oppositely doped region into said first storage capacitor;

transferring first and second charge packets from said oppositely doped region into said first and second storage capacitors;

intermediately storing said first and second charge packets in said first and second storage capacitors; and rapidly transferring charge from said first and second storage capacitors into said means for transferring charge to said output stage.

15. The method of claim 14 wherein said first and second capacitors are disposed in series between said oppositely doped region and said means for transferring charge to said output stage further defined by the steps of:

transferring said first charge packet into said first storage capacitor from said oppositely doped region;

transferring said first charge packet from said first storage capacitor into said second storage capacitor;

transferring said first charge packet into said means for transferring charge to said output stage;

transferring said second charge packet into said first storage capacitor;

transferring said second charge packet from said first storage capacitor into said second storage capacitor; and transferring said second charge packet from said second storage capacitor into said means for transferring charge to said output stage.

16. The method of claim 15 wherein said means for transferring charge to said output stage is comprised of first and second charge transfer devices and wherein the step of transferring said first charge packet from said second storage capacitor into said means for transferring charge to said output stage is further defined by transferring said first charge packet into said first charge transfer device, and wherein the step of transferring said second charge packet from said second storage capacitor into said means for transferring charge to said output stage is further defined by transferring said second charge packet into said first charge transfer device, including the additional step of:

transferring said first charge packet from said first charge transfer device into said second charge transfer device before transferring said second charge packet into said first charge transfer device.

17. The method of claim 14 wherein said first and second storage capacitors are disposed in parallel between said oppositely doped region and said means for transferring charge to said output stage further defined by the steps of:

transferring a first charge packet from said oppositely doped region into said first storage capacitor;

transferring a second charge packet from said oppositely doped region into said second storage capacitor; and simultaneously transferring said first and second charge packets from said first and second storage capacitors into said means for transferring charge to said output stage.

18. The method of claim 17 wherein said means for transferring charge to said output stage is comprised of first and second charge transfer devices and wherein the step of simultaneously transferring said first and second charge packets into said means for transferring charge to said output stage is further defined by transferring said first and second charge packets from said first and second storage capacitors into said first charge transfer device, comprising the additional step of:

transferring said first charge packet from said first charge transfer device into said second charge transfer device.

19. The method of claim 17 wherein said means for transferring charge to said output stage is a charge transfer device having a plurality of successive transfer stages and wherein the step of transferring said first and second charge packets from said first and second storage capacitors into said means for transferring charge to said output stage is further defined by transferring said first and second charge packets from said first and second storage capacitors into alternate transfer stages of said charge transfer device.

20. The method of claim 14 wherein said step of intermediately storing charge from said oppositely doped region in said first and second storage capacitors is further defined by intermediately storing said charge in said first and second storage capacitors for a period of 52 μs.

* * * * *